US012756974B2

(12) United States Patent
Tang et al.

(10) Patent No.: US 12,756,974 B2
(45) Date of Patent: Oct. 6, 2026

(54) AUTO-RECOVERY OVERCURRENT PROTECTION FOR AUDIO NOTIFICATION APPLIANCE CIRCUIT IN FIRE PROTECTION SYSTEM

(71) Applicant: Tyco Fire & Security GMBH, Neuhausen am Rheinfall (CH)

(72) Inventors: Sai Chun Tang, Auburndale, MA (US); Saurabh Bagkar, Westford, MA (US)

(73) Assignee: Tyco Fire & Security GMBH, Neuhausen am Rheinfall (CH)

( * ) Notice: Subject to any disclaimer, the term of this patent is extended or adjusted under 35 U.S.C. 154(b) by 124 days.

(21) Appl. No.: 18/752,468

(22) Filed: Jun. 24, 2024

(65) Prior Publication Data

US 2025/0392860 A1 Dec. 25, 2025

(51) Int. Cl.
*H04R 3/00* (2006.01)
*H03F 3/183* (2006.01)
*H03G 7/06* (2006.01)

(52) U.S. Cl.
CPC ............. *H04R 3/007* (2013.01); *H03F 3/183* (2013.01); *H03G 7/06* (2013.01); *H03F 2200/03* (2013.01)

(58) Field of Classification Search
CPC ..... H04R 3/007; H03F 3/183; H03F 2200/03; H03G 7/06; G08B 29/10; G08B 29/18; G08B 3/10
See application file for complete search history.

(56) References Cited

FOREIGN PATENT DOCUMENTS

| | | | | |
|---|---|---|---|---|
| JP | S58-219898 A | 12/1983 | | |
| JP | 2001-028798 A | 1/2001 | | |
| JP | 2014-216704 A | 11/2014 | | |
| KR | 20100005867 A * | 1/2010 | ............... | H03F 1/52 |

OTHER PUBLICATIONS

English machine translation of JP2001028798A (Ando et al.; Short Circuit Detector for Loudspeaker Line; published Jan. 2001) (Year: 2001).*
English machine translation of JP2014216704A (Nakajima, Yoshitada; Speaker Driving Circuit Having Short-Circuit and Failure Detecting Function and Detection Method Therefor; published Nov. 2014) (Year: 2014).*
Invitation to Pay Additional Fees received for PCT Patent Application No. PCT/US2025/029585, mailed on Jul. 17, 2025, 12 pages.

* cited by examiner

*Primary Examiner* — Mark Fischer
(74) *Attorney, Agent, or Firm* — ArentFox Schiff LLP

(57) ABSTRACT

An audio system is provided. The aspects include a notification appliance circuit (NAC) having one or more speakers configured to reproduce sound. The aspects include an amplifier circuit configured to drive the one or more speakers. The aspects include a relay circuit configured to selectively connect or disconnect the speakers to or from the amplifier circuit responsive to an enable amplifier control signal or a disable amplifier control signal, respectively. The aspects include a logic element configured to generate the enable amplifier control signal or the disable amplifier control signal responsive to an absence or a presence of an overcurrent condition in an output of the amplifier circuit, respectively. The aspects include an overcurrent detection circuit configurated to detect the absence or the presence of the overcurrent condition.

19 Claims, 7 Drawing Sheets

AUTO-RECOVERY OVERCURRENT PROTECTION FOR AUDIO NOTIFICATION APPLIANCE CIRCUIT IN FIRE PROTECTION SYSTEM

TECHNICAL FIELD

Aspects of the present disclosure relate generally to systems and methods for auto-recovery overcurrent protection for an audio notification appliance circuit in a fire protection system.

BACKGROUND

Replaceable fuses are widely used in audio notification appliance circuits (NACs) in fire protection systems to protect the equipment from being damaged by overcurrent. Once overcurrent happens and the fuse blows, the customer of the system needs to call a service field technician to come and replace the fuse. An audio NAC with a broken fuse will be disabled until the fuse is replaced. This may cause safety issues during the waiting period. In addition, although the cost of the replaceable fuse itself may not be expensive, sending a qualified service technician to the site for replacing a fuse is not cost effective.

SUMMARY

The following presents a simplified summary of one or more aspects to provide a basic understanding of such aspects. This summary is not an extensive overview of all contemplated aspects and is intended to neither identify key or critical elements of all aspects nor delineate the scope of any or all aspects. Its sole purpose is to present some concepts of one or more aspects in a simplified form as a prelude to the more detailed description that is presented later.

According to an aspect of the present disclosure, an audio system is provided. The audio system includes a notification appliance circuit (NAC) having one or more speakers configured to reproduce sound. The audio system further includes an amplifier circuit configured to drive the one or more speakers. The audio system also includes a relay circuit configured to selectively connect or disconnect the speakers to or from the amplifier circuit responsive to an enable amplifier control signal or a disable amplifier control signal, respectively. The audio system additionally includes a logic element configured to generate the enable amplifier control signal or the disable amplifier control signal responsive to an absence or a presence of an overcurrent condition in an output of the amplifier circuit, respectively. The audio system further includes an overcurrent detection circuit configurated to detect the absence or the presence of the overcurrent condition.

According to other aspects of the present disclosure, a method of operating an audio system is provided. The method includes configuring a notification appliance circuit (NAC) having one or more speakers to reproduce sound. The method further includes configuring an amplifier circuit to drive the one or more speakers. The method also includes configuring a relay circuit to selectively connect or disconnect the speakers to or from the amplifier circuit responsive to an enable amplifier control signal or a disable amplifier control signal, respectively. The method additionally includes configuring a logic element to generate the enable amplifier control signal or the disable amplifier control signal responsive to an absence or a presence of an overcurrent condition in an output of the amplifier circuit, respectively. The method further includes configuring an overcurrent detection circuit to detect the absence or the presence of the overcurrent condition.

According to still further aspects of the present disclosure, a method of operating an audio system is provided. The method includes selectively driving, by an amplifier circuit, one or more speakers of a notification appliance circuit (NAC). The method further includes selectively connecting or disconnecting, by a relay circuit, the amplifier circuit from or to the one or more speakers responsive to an enable amplifier control signal or a disable amplifier control signal, respectively. The method also includes detecting, by an overcurrent detection circuit, an absence or a presence of an overcurrent condition in an output of the amplifier circuit. The method additionally includes generating, by a logic element, the enable amplifier control signal or the disable amplifier control signal responsive to the absence or the presence of the overcurrent condition in the output of the amplifier circuit, respectively.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which.

DETAILED DESCRIPTION

Aspects of the present disclosure are directed to systems and methods for auto-recovery overcurrent protection for a notification appliance circuit (NAC), such as an audio circuit for generating a sound alert and/or a lighting circuit for generating a light alert, in a fire protection system.

Aspects of the present disclosure provide a safe and reliable auto-recovery overcurrent protection system and method with minimal manufacturing cost for an NAC in a fire protection system. Once overcurrent occurs, the protection circuit will break the amplifier circuit immediately and automatically resume normal operation when the overcurrent condition is cleared. The system and method can eliminate the need of sending a service technician to the site for replacing a fuse, so it will significantly reduce the operational cost and eliminate the risk of the alerting capability of the notification appliance being inoperable during the time waiting for a technician to replace the fuse.

Aspects of the present disclosure may provide various additional advantageous features.

One exemplary advantageous feature of the present disclosure includes selectively disconnecting, for example, an audio or lighting NAC from an amplifier circuit using a relay circuit responsive to the detection of an overcurrent condition in an output current of the amplifier circuit. In this way, damage to the audio or lighting NAC can be prevented. Moreover, in an aspect, a MUTE signal may be sent prior to such selective disconnection of the audio NAC from the amplifier circuit to reduce the chance of arcing to the electrodes of the relay circuit by reducing the current from the amplifier circuit to essentially zero before actually breaking the amplifier circuit from the audio NAC. Similarly, a dimming signal may be sent prior to such selective disconnection of the lighting NAC from the amplifier circuit for similar reasons.

A further significant advantage of the present disclosure is the lack of requiring a technician to come into the field to replace a fuse in a conventional NAC that experiences an overcurrent condition. Instead, the relay circuit of the present disclosure is reset using an enable amplifier (EnAMP) signal that connects the amplifier circuit to the audio or lighting NAC. This is done upon resolution of the overcurrent condition, thus sparing the expense of dispatching a technician to replace a fuse, with the relay circuit replacing the fuse under the automatic control of several inexpensive components.

Figure 1:
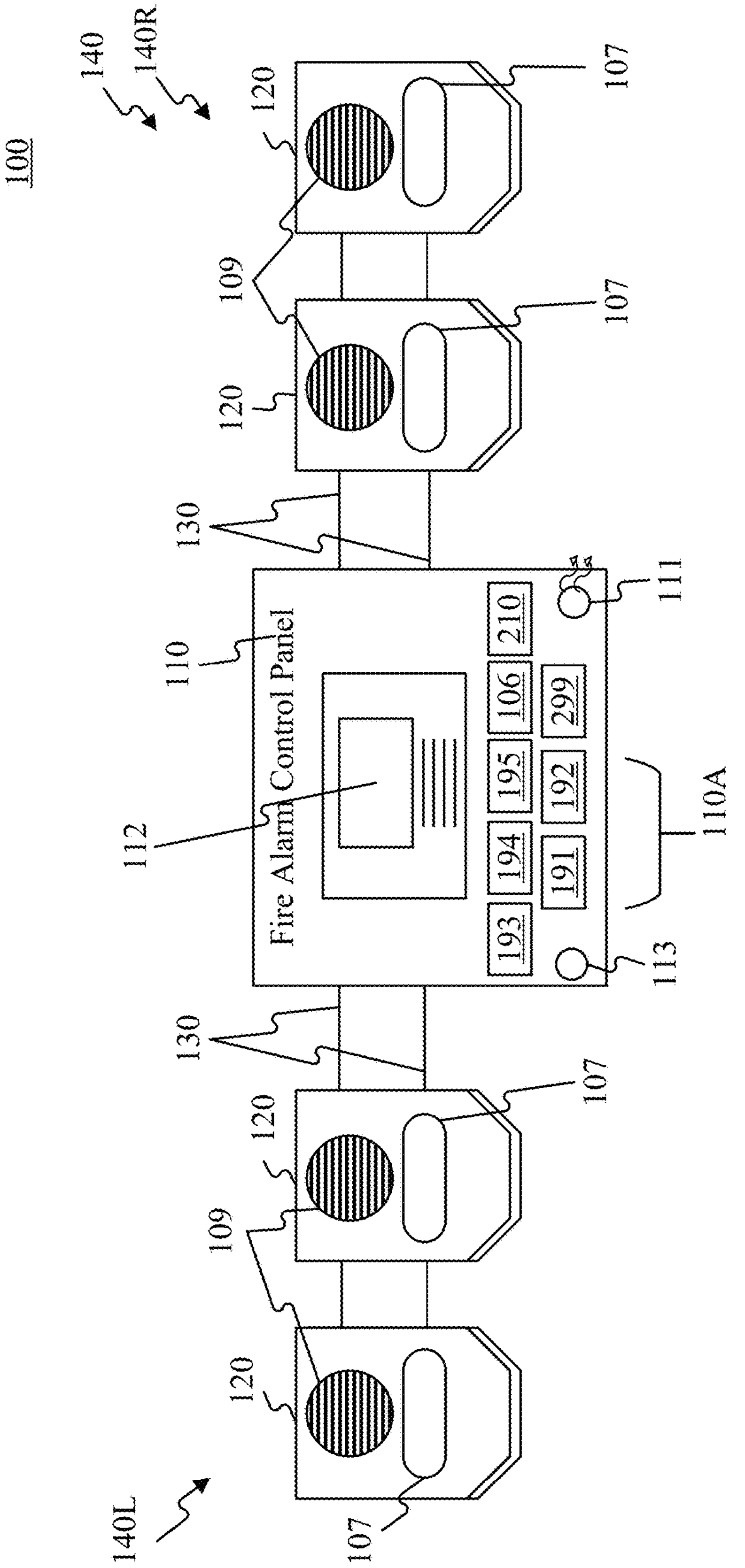
FIG. 1 illustrates a block diagram of a fire alarm system having multiple remote devices that each include one or more notification appliance circuits (NACs), in accordance with example aspects of this disclosure.

Referring now to FIG. 1, an example fire notification system 100, also referred to as a fire alarm system, is shown, according to an exemplary aspect. Fire notification system 100 is a system for providing notification in the case of a fire. In accordance with various aspects of the disclosure, fire notification system 100 includes remote devices 120, which can be any devices capable of detecting a fire or other emergency condition and relaying audible, visible, or other stimuli to alert building occupants of the fire or other emergency condition. Remote devices 120 can include, but are not limited to, any of the following: a speaker, a buzzer, a light (e.g., LED), and so forth.

Fire notification system 100 can be any system that includes a fire alarm control panel 110 (FACP) and a plurality of remote devices 120 interconnected by fire notification system wiring 130. The FACP 110 is connected via the fire notification system wiring 130 in a loop 140 to the plurality of remote devices 120 such that the loop 140 is bisected or otherwise separated by the FACP 110 into a right side loop 140R and a left side loop 140L. While in the example of FIG. 1, each of the groups represent a set having only 2 members, implementations can have any number of members including in the tens or hundreds or more, and each group may have a different number of members. Of course, other numbers of loops can be used depending on the implementation.

Remote devices 120 may be powered by fire notification system wiring 130. The fire notification system 100 may include one or more lighting devices 107 to generate a light-based alert, and/or one or more speaker devices 109 to generate a sound-based alert. In other words, lighting device (s) 107 can be implemented as a light emitting device or any component in fire notification system 100 that alerts occupants of an emergency by emitting a visible light signal. In some aspects, fire notification system 100 emits strobe flashes to alert building occupants of an emergency situation. Similarly, in other words, a sound notification module can be a speaker 109 or any component in the fire notification system 100 that alerts occupants of an emergency by emitting an audible signal. In some aspects, which should not be construed as limiting, fire notification system 100 may emit one or more audible signals.

Advantageously, the FACP 110 additionally includes an auto-recovery overcurrent protection circuit 106 associated with one or more speakers (or appliances) to protect the amplifier 210 and relay 215. The auto-recovery overcurrent protection circuit 106 is intended to help a customer avoid a service call for an over-current and/or a short-circuit fault, so that the customer can identify the faulty device(s) (based on the trouble log) and remove that device(s) or fault from the system. The short circuit fault may result from a faulty device or the wires 130 may be accidently shorted by a person, an animal, or any metal or conductive object. Then the NAC channel is enabled again to continue the system operation without any further hardware change. Thus, in these situations, the overcurrent or short-circuit fault may be cleared by itself, then the auto-recovery circuit 106 may enable the amplifier circuit again and the NAC channel will persist in functioning without the necessity for human oversight. The structure and operation of the auto-recovery overcurrent protection circuit 106 is described in more detail in reference to FIG. 2 below.

The FACP 110 includes one or more memories 191, individually or in combination, having instructions executable by one or more processors 192 to perform the actions described herein to quickly and efficiently connect a new device to a hardware I/O IF. The FACP 110 includes one or more processors 192 each coupled to at least one of the one or more memories 191 and configurable to execute the instructions. The one or more memories 191 and the one or more processors 192 implement a loop break indicator 110A as described in further detail herein. The instructions can be, for example, based on method 300 of FIGS. 3-4, and the method 500 of FIGS. 5-6.

As used herein, a processor, at least one processor, and/or one or more processors, individually or in combination, configured to perform or operable for performing a plurality of actions is meant to include at least two different processors able to perform different, overlapping or non-overlapping subsets of the plurality actions, or a single processor able to perform all of the plurality of actions. In one non-limiting example of multiple processors being able to perform different ones of the plurality of actions in combination, a description of a processor, at least one processor, and/or one or more processors configured or operable to perform actions X, Y, and Z may include at least a first processor configured or operable to perform a first subset of X, Y, and Z (e.g., to perform X) and at least a second processor configured or operable to perform a second subset of X, Y, and Z (e.g., to perform Y and Z). Alternatively, a first processor, a second processor, and a third processor may be respectively configured or operable to perform a respective one of actions X, Y, and Z. It should be understood that any combination of one or more processors each may be configured or operable to perform any one or any combination of a plurality of actions.

In an aspect, FACP 110 further includes a connection port 193 for connecting a remote device (e.g., a laptop, a tablet, etc.), an input device 194 for receiving user inputs, a transceiver 195 for communicating with remote devices (e.g., a remote station, a smart phone, and so forth), and a display 112 for displaying operations. In an aspect, FACP 110 may include a speaker 113 for indicating information such as an alarm (e.g., fire, wire break, etc.), a serial number, a device type, a device status, and so forth and/or a light source (LED) 111 for flashing when there is a fire or a problem. Input device 194 may be a joystick, keypad, keyboard, mouse, touch-screen display, camera, microphone device and/or so forth.

Figure 2:
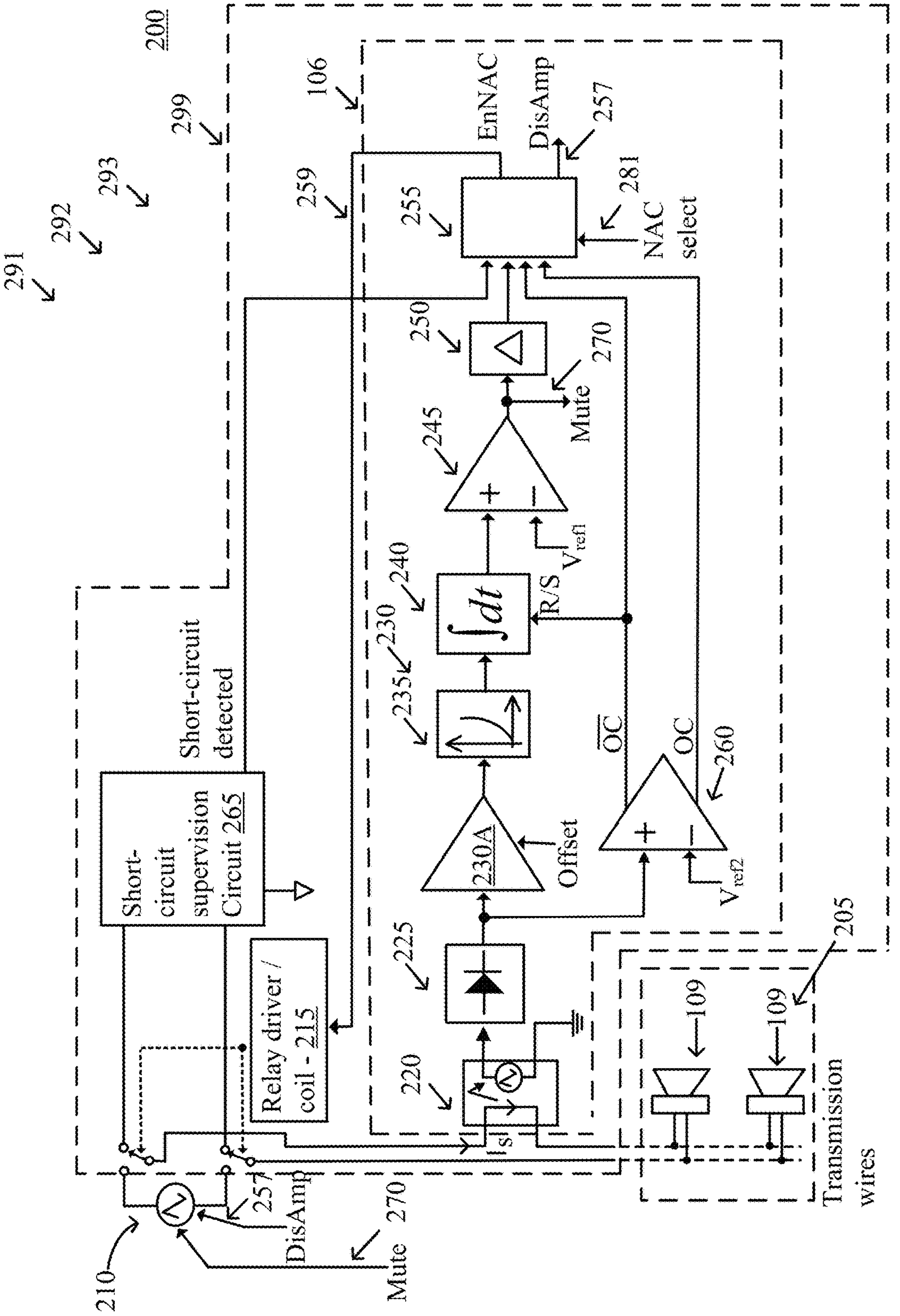
FIG. 2 illustrates a block diagram of an audio system having a NAC, in accordance with example aspects of this disclosure.

Referring to FIG. 2, an example of the auto-recovery overcurrent protection circuit 106 is described with reference to an audio system 200 having a NAC 299 connected to a speaker circuit 205 with one or more speaker devices 109 to generate a sound-based alert, according to an example aspect. It should be understood that the auto-recovery overcurrent protection circuit 106 may be similarly implemented in the NAC 299 and connected to a lighting circuit with one or more lighting devices 107 to generate a light-based alert, e.g., in a lighting system.

The audio system 200 additionally includes:

an amplifier circuit 210;

a relay circuit 215;

a current sensor 220;

a rectifier 225;

an amplifier 230;

a non-linear amplifier 235;

an integrator 240, a comparator 245;

a delay circuit 250;

a logic element (e.g., programmable logic array (PLA)) 255;

an overcurrent detection circuit 260; and a short-circuit supervision circuit 265.

The types of output signals from logic element 255 may include, for example, a disable signal (DisAmp) 257 sent to amplifier circuit 210 to disable amplifier circuit 210, and an enable NAC signal (EnNAC) 259 sent to relay circuit 215 to enable amplifier circuit 210. "Enable" and "disable" refer to respectively connecting or disconnecting amplifier circuit 210 to or from speaker circuit 205 using relay circuit 215 which may include a driver and coil responsive to the driver state (open or closed). Conditions resulting in speaker circuit 205 being disconnected from amplifier circuit 210 include an overcurrent condition due to spurious noise or other cause (e.g., cresting, etc.) responsible for a current spike in the output of amplifier circuit 210 and also include a short circuit condition, e.g., across the input and the output of amplifier circuit 210.

Another type of output signal provided by audio system 200 is an amplifier "MUTE" signal 270. The MUTE signal 270 is used to simply mute the output of amplifier circuit 210 versus disconnecting the output of amplifier circuit 210 from speaker circuit 205. This may be desirable to reduce the output of amplifier circuit 210 to zero or close to zero to prevent arcing when subsequently disconnecting amplifier circuit 210 from speaker circuit 205.

In an aspect, a first subsystem 291 includes speaker circuit 205, amplifier circuit 210, relay circuit 215, current sensor 220, rectifier 225, overcurrent detection circuit 260, and logic element 255. Expected outputs generated by logic element 255 from subsystem 291 include the DisAmp signal 257 and the EnNAC signal 259.

In an aspect, a second subsystem 292 includes speaker circuit 205, amplifier circuit 210, relay circuit 215, current sensor 220, rectifier 225, amplifier 230, non-linear amplifier 235, integrator 240, comparator 245, delay circuit 250, and logic element 255. Expected outputs generated by logic element 255 from subsystem 292 include the DisAmp signal 257 and the EnNAC signal 259. Expected outputs generated by comparator 245 from subsystem 292 include the MUTE signal 270.

In an aspect, a third subsystem 293 includes speaker circuit 205, amplifier circuit 210, relay circuit 215, and short circuit supervision circuit 265. Expected outputs generated by logic element 255 from short circuit supervision circuit 265 include the DisAmp signal 257 and the EnNAC signal 259.

A NAC select signal 281 is used to select a given NAC to evaluate and control at any given time. The NAC select signal 281 depends on the number of NACs connected and allows for selection of any connected NAC for the purposes of evaluation and control. The relays are used to connect or disconnect NAC 299 from power amplifier 210. The NAC select signal 281 is used to send a command to control relay circuit 215 to connect or disconnect the NAC 299 associated with the over-current protection circuit from power amplifier 210.

The following high-level functionality of the elements of the audio system 200 will be followed by more detailed descriptions of the elements of the audio system 200 during normal operation and during an overcurrent condition.

Speaker circuit 205 is configured to produce sounds and may include one or more speakers 109. Amplifier circuit 210 is configured to drive the speakers 109 of the speaker circuit 205. Relay circuit 215 is configured to selectively connect or disconnect speakers 109 of speaker circuit 205 from amplifier circuit 210 responsive to the existence of a normal current condition or an overcurrent condition, respectively, of the output current of amplifier circuit 210.

Current sensor 220 is configured to sense the AC signal from amplifier circuit 210. Rectifier 225 is configured to convert the AC signal to a corresponding Direct Current (DC) signal. An amplifier 230 includes amplifier 230A and non-linear amplifier 235. Amplifier 230A is configured to amplify the amplitude of the DC signal output from the rectifier 225. Non-linear amplifier 235 is placed between amplifier 230A and integrator 240 to make a response speed of a circuit sub-portion exponentially proportional to an amplitude of the amplified DC signal. Integrator 240 is configured to smooth out peaks in the output voltage of the non-linear amplifier 235. Comparator 245 is configured to compare the smoothed voltage signal from the integrator 240 to a first reference voltage signal Vref1. Delay circuit 250 is configured to delay the comparator output signal to the logic element 255 to prevent contact arcing in the relay circuit 215.

Overcurrent detection circuit 260 is configured to detect an overcurrent condition of the output of amplifier circuit 210 relative to a threshold current value. Short-circuit supervision circuit 265 is configured to detect a short circuit in the output of amplifier circuit 210.

In an aspect, in the normal operation of audio system 200, speaker circuit 205 is connected to an output of amplifier circuit 210 through double-pole-double-throw (DPDT) relay circuit 215. The AC load current of speaker circuit 205 may be sensed by current sensor 220 and converted to a corresponding AC signal for input into rectifier 225. Current sensor 220 may use magnetic-based methods (e.g., the open-loop Hall effect, the closed-loop Hall effect, etc.), fiberoptic-based methods (e.g., the Faraday effect), and/or so forth to sense the AC load current of speaker circuit 205. Rectifier 225 may be used to convert the AC signal from current sensor 220 to a value representing the amplitude of the AC signal from current sensor 220. In an aspect, rectifier 225 includes one or more diodes. In an aspect directed to protecting amplifier circuit 210, especially when the output current of amplifier circuit 210 is much higher than the maximum rate value or a short-circuit happens between the input and the output of amplifier circuit 210, non-linear amplifier 235 is used to exponentially reduce the time to disconnect amplifier circuit 210 from the load portion (speaker circuit 205) of audio system 200 due to the very low impact of the input voltage of non-linear amplifier 235 on the output voltage of non-linear amplifier 235. Thus, fluctuation changes from amplifier 230 are essentially made to have a slower impact on the downstream components (e.g., relay circuit 215) by the inclusion of non-linear amplifier 235. Integrator 240 operates when the SET input of integrator 240 is enabled by the output of overcurrent detection circuit 260; otherwise (RESET input of integrator 240 is enabled), the output of integrator 240 is 0 V. Since, in actual audio signals, the crest factor can be very high, i.e., the signal amplitude can fluctuate a lot, it may be desirable to avoid the high but narrow peak from mis-triggering unwarranted action such as disconnecting amplifier circuit 210 from speaker circuit 205. In an aspect, integrator 240 may be used to smooth out the signal amplitude and protection is triggered by the accumulated signal energy instead of the signal amplitude. In an aspect, integrator 240 operates to provide an output to comparator 245 only when an overcurrent condition has been detected by the overcurrent detection circuit 260 of first subsystem 291; otherwise, the output of the integrator 240 is essentially 0 V. That is, integrator 240 will start operating upon receiving a signal from overcurrent detection circuit 260 showing the sensed and rectified current amplitude is higher than a preset threshold level, otherwise the output of overcurrent detection circuit 260 is 0 V and relay circuit 215 keeps amplifier circuit 210 connected to speaker circuit 205.

When the accumulated energy is higher than a preset threshold, comparator 245 will send the MUTE signal 270 to amplifier circuit 210 so the output of amplifier circuit 210 will become zero. Amplifier circuit 210 will take a certain time to respond, so delay circuit 250 is added to make sure relay circuit 215 will be turned off after the amplifier output current becomes 0A or very low level to avoid the contacts of relay circuit 215 from being degraded or damaged by arcing. In the case if the amplifier output current is not zero even a mute signal was sent, it means that the overcurrent may be caused by a malfunction of amplifier circuit 210 instead of a short circuit of speaker circuit 205. Then, the contacts of relay circuit 215 should not be forced to open, instead amplifier circuit 210 should be disabled to make sure the output current of amplifier circuit 210 will be zero so as to prevent damage from occurring to any component in audio system 200. The DisAmp signal 257 is generated by logic element 255 and sent to the Shutdown input of an amplifier power stage of amplifier circuit 210.

The EnNAC signal 259 is generated by logic element 255 to enable the NAC to be powered by the amplifier circuit through relay circuit 215.

A description will now be given of some of the many attendant advantages of various aspects of the present disclosure.

In an aspect, the present disclosure provides an auto-recovery system and method that does not require a service technician going to the site to replace a fuse, which is the approach used for conventional fire alarm systems having audio notification appliance circuits (NACs).

In an aspect, the auto-recovery system includes a non-linear amplifier to better protect a NAC when the load current is much higher than the rated value or a short circuit occurs.

In an aspect, a Hall-effect current sensor may be used in place, e.g., a current transformer and shunt resistor, so the size and power consumption of a NAC employing the teachings of the present disclosure are minimized.

The trap time and current level can be selected flexibly by choosing appropriate resistance values in the integrator and comparator, while typical off-the-shelf fuses do not have much flexibility.

Figure 3:
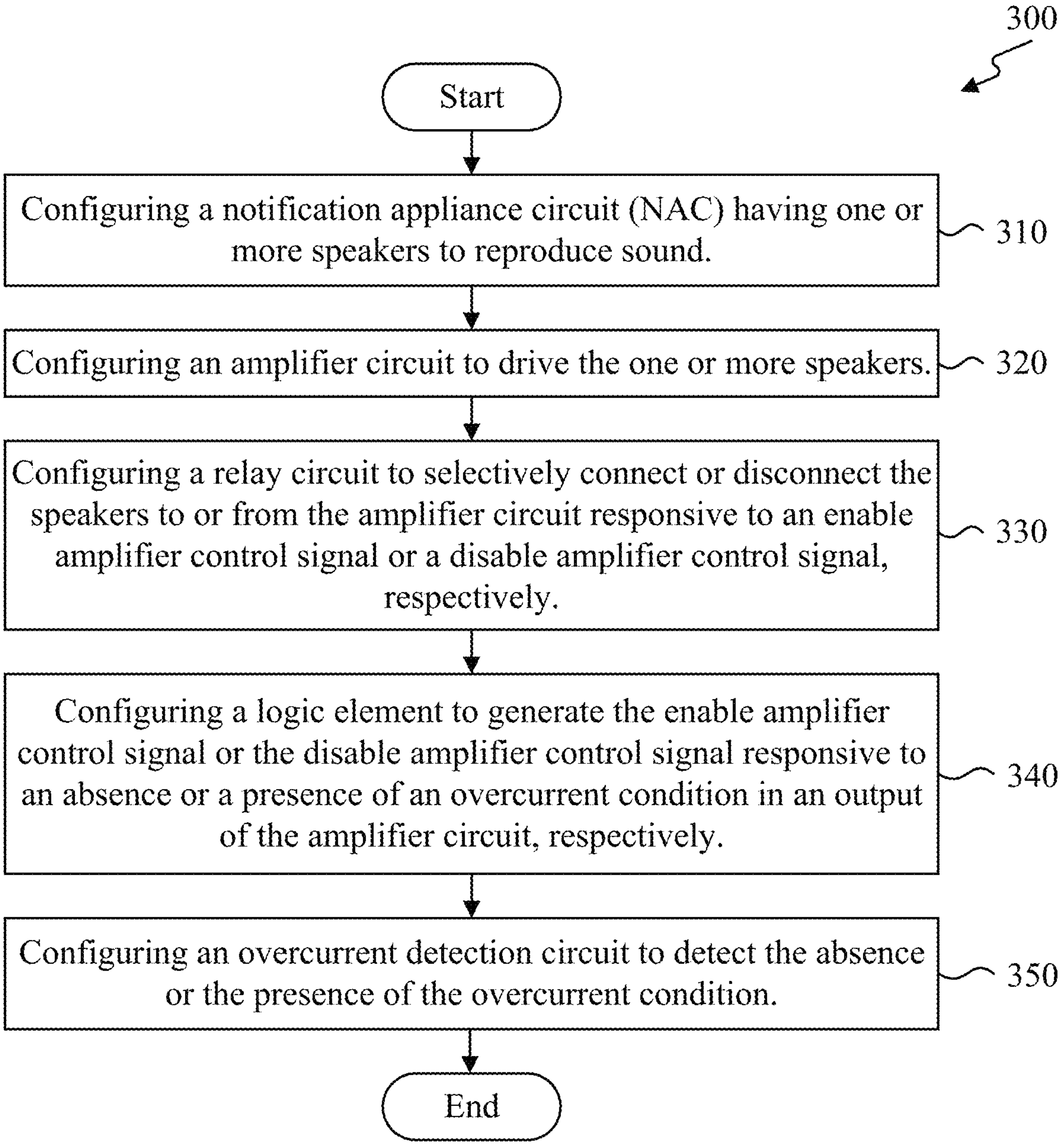
FIGS. 3-6 illustrate a flowchart of an example of a method for auto-recovery overcurrent protection for an audio notification appliance circuit in a fire protection system, in accordance with example aspects of this disclosure.
Figure 4:
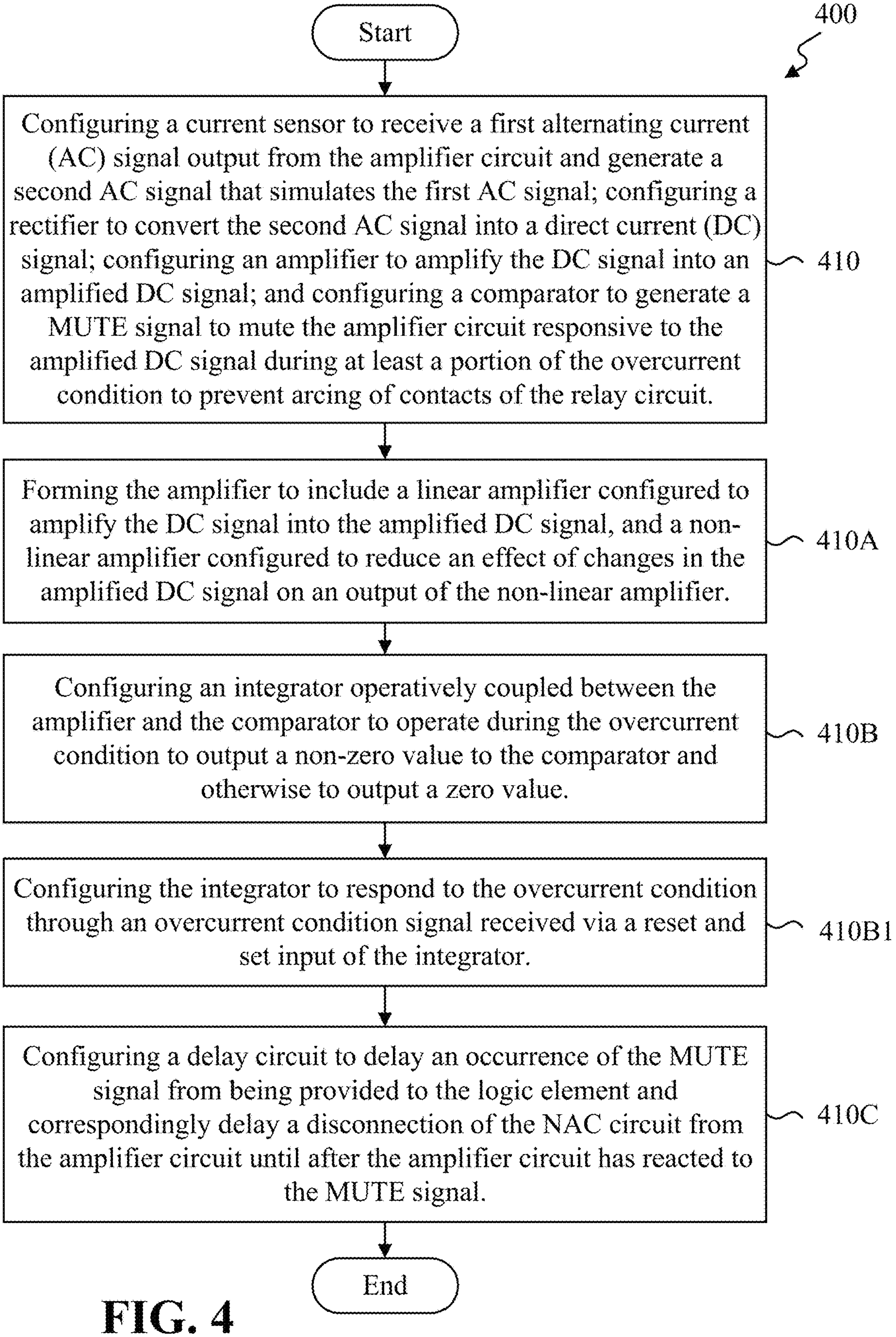

Referring now to FIGS. 3-6, methods 300 and 500 for auto-recovery overcurrent protection for an audio notification appliance circuit (NAC) in a fire protection system are shown and described in accordance with various exemplary aspects. Boxes shown in dashes are optional features. FIGS. 3-4 correspond to method 300, and FIGS. 5-6 corresponds to method 500.

Methods 300 and 500 may be performed by at least in part performed by one or more processors (e.g., one or more processors 192 of FIG. 1) operatively coupled to one or more memories (e.g., one or more memories 191 of FIG. 1).

Figure 5:
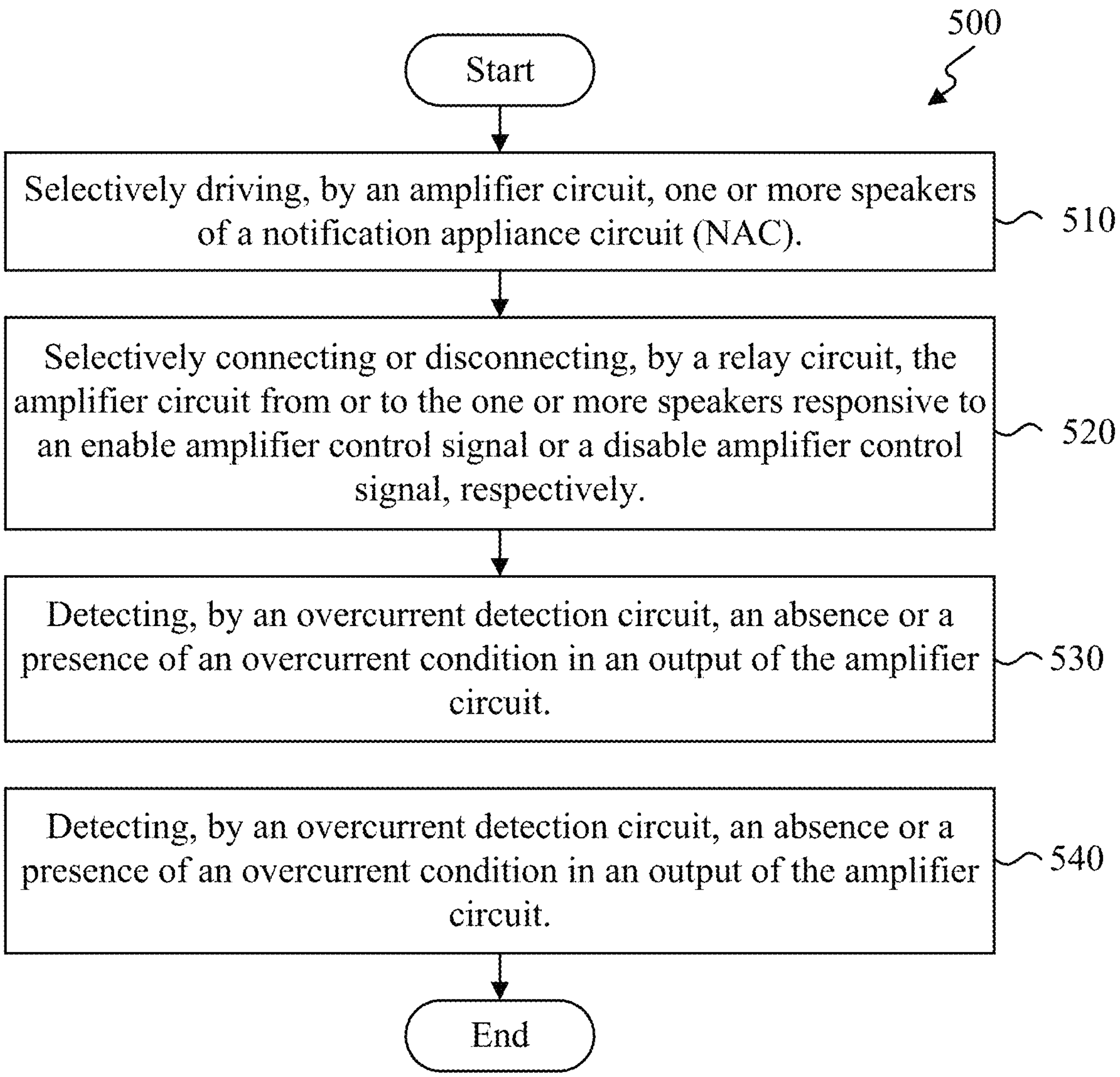
Figure 6:
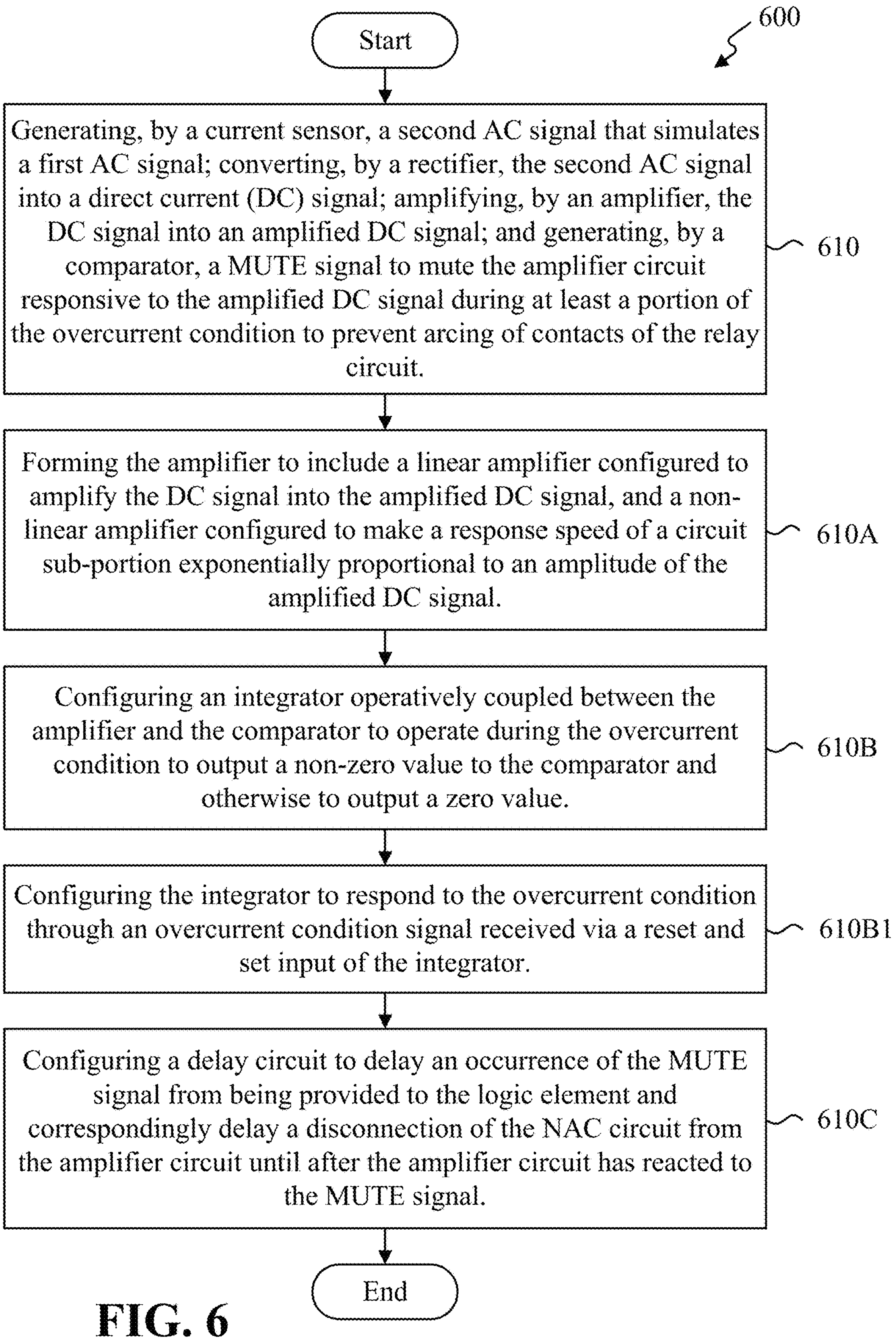

The method 300 of FIGS. 3 and 4 pertain to a method of configuring a NAC, while the method 500 of FIGS. 5 and 6 pertain to using a NAC.

Referring now to FIG. 3, at block 310, the method 300 includes configuring a notification appliance circuit (NAC) 205 having one or more speakers 109 to reproduce sound.

At block 320, the method 300 includes configuring an amplifier circuit 210 to drive the one or more speakers 109.

At block 330, the method 300 includes configuring a relay circuit 215 to selectively connect or disconnect the speakers 109 to or from the amplifier circuit 210 responsive to an enable amplifier control signal 259, e.g. EnNAC signal, or a disable amplifier control signal 257, e.g. DisAMP signal, respectively.

At block 340, the method 300 includes configuring a logic element 255 to generate the enable amplifier control signal (EnNAC) 259 or the disable amplifier control signal (DisAmp) 257 responsive to an absence or a presence of an overcurrent condition in an output of the amplifier circuit 210, respectively.

At block 350, the method 300 includes configuring an overcurrent detection circuit 260 to detect the absence or the presence of the overcurrent condition.

Referring now to FIG. 4, at block 410, the method 300 includes: configuring a current sensor 220 to receive a first alternating current (AC) signal output from the amplifier circuit 210 and generate a second AC signal that simulates the first AC signal; configuring a rectifier 225 to convert the second AC signal into a direct current (DC) signal; configuring an amplifier 230 to amplify the DC signal into an amplified DC signal; and configuring a comparator 245 to generate a MUTE signal to mute the amplifier circuit 210 responsive to the amplified DC signal during at least a portion of the overcurrent condition to prevent arcing of contacts of the relay circuit 215.

In an aspect, block 410 may include one or more of blocks 410 through 410C.

At block 410A, the method 300 includes forming the amplifier 230 to include a linear amplifier 230A configured to amplify the DC signal into the amplified DC signal, and a non-linear amplifier 235 configured to make a response speed of a circuit sub-portion exponentially proportional to an amplitude of the amplified DC signal.

At block 410B, the method 300 includes configuring an integrator 240 operatively coupled between the amplifier 230 and the comparator 245 to operate during the overcurrent condition to output a non-zero value to the comparator 245 and otherwise to output a zero value.

In an aspect, block 410B may include block 410B1.

At block 410B1, the method 300 includes configuring the integrator 240 to respond to the overcurrent condition through an overcurrent condition signal received via a reset and set input of the integrator 240.

At block 410C, the method 300 includes configuring a delay circuit 250 to delay an occurrence of the MUTE signal 270 from being provided to the logic element 255 and correspondingly delay a disconnection of the speaker circuit 205 from the amplifier circuit 210 until after the amplifier circuit 210 has reacted to the MUTE signal 270.

Referring now to FIG. 5, at block 510, the method 500 includes selectively driving, by an amplifier circuit, one or more speakers of a notification appliance circuit (NAC).

At block 520, the method 500 includes selectively connecting or disconnecting, by a relay circuit 215, the amplifier circuit 210 from or to the one or more speakers 109 responsive to an enable amplifier control signal EnNAC or a disable amplifier control signal DisAmp, respectively.

At block 530, the method 500 includes detecting, by an overcurrent detection circuit 260, an absence or a presence of an overcurrent condition in an output of the amplifier circuit 210.

At block 540, the method 500 includes generating, by a logic element 255, the enable amplifier control signal (EnNAC) 259 or the disable amplifier control signal (disAMP) 257 responsive to the absence or the presence of the overcurrent condition in the output of the amplifier circuit 210, respectively.

Referring now to FIG. 6, at block 610, the method 500 includes: generating, by a current sensor 220, a second AC signal that simulates a first AC signal; converting, by a rectifier 225, the second AC signal into a direct current (DC) signal; amplifying, by an amplifier 230, the DC signal into an amplified DC signal; and generating, by a comparator 245, a MUTE signal to mute the amplifier circuit responsive to the amplified DC signal during at least a portion of the overcurrent condition to prevent arcing of contacts of the relay circuit 215.

In an aspect, block 610 may include one or more of blocks 610A through 610C.

At block 610A, the method 500 includes forming the amplifier 230 to include a linear amplifier 230A configured to amplify the DC signal into the amplified DC signal, and a non-linear amplifier 235 configured to make a response speed of a circuit sub-portion exponentially proportional to an amplitude of the amplified DC signal. The sub-portion includes the current sensor 220, the rectifier 225, and the linear amplifier 230A.

At block 610B, the method 500 includes configuring an integrator 240 operatively coupled between the amplifier 230 and the comparator 245 to operate during the overcurrent condition to output a non-zero value to the comparator 245 and otherwise to output a zero value.

In an aspect, block 610B may include block 610B1.

At block 610B1, the method 500 includes configuring the integrator 240 to respond to the overcurrent condition through an overcurrent condition signal received via a reset and set input of the integrator 240.

At block 610C, the method 500 includes configuring a delay circuit 250 to delay an occurrence of the MUTE signal 270 from being provided to the logic element 255 and correspondingly delay a disconnection of the speaker circuit 205 from the amplifier circuit 210 until after the amplifier circuit 210 has reacted to the MUTE signal.

Figure 7:
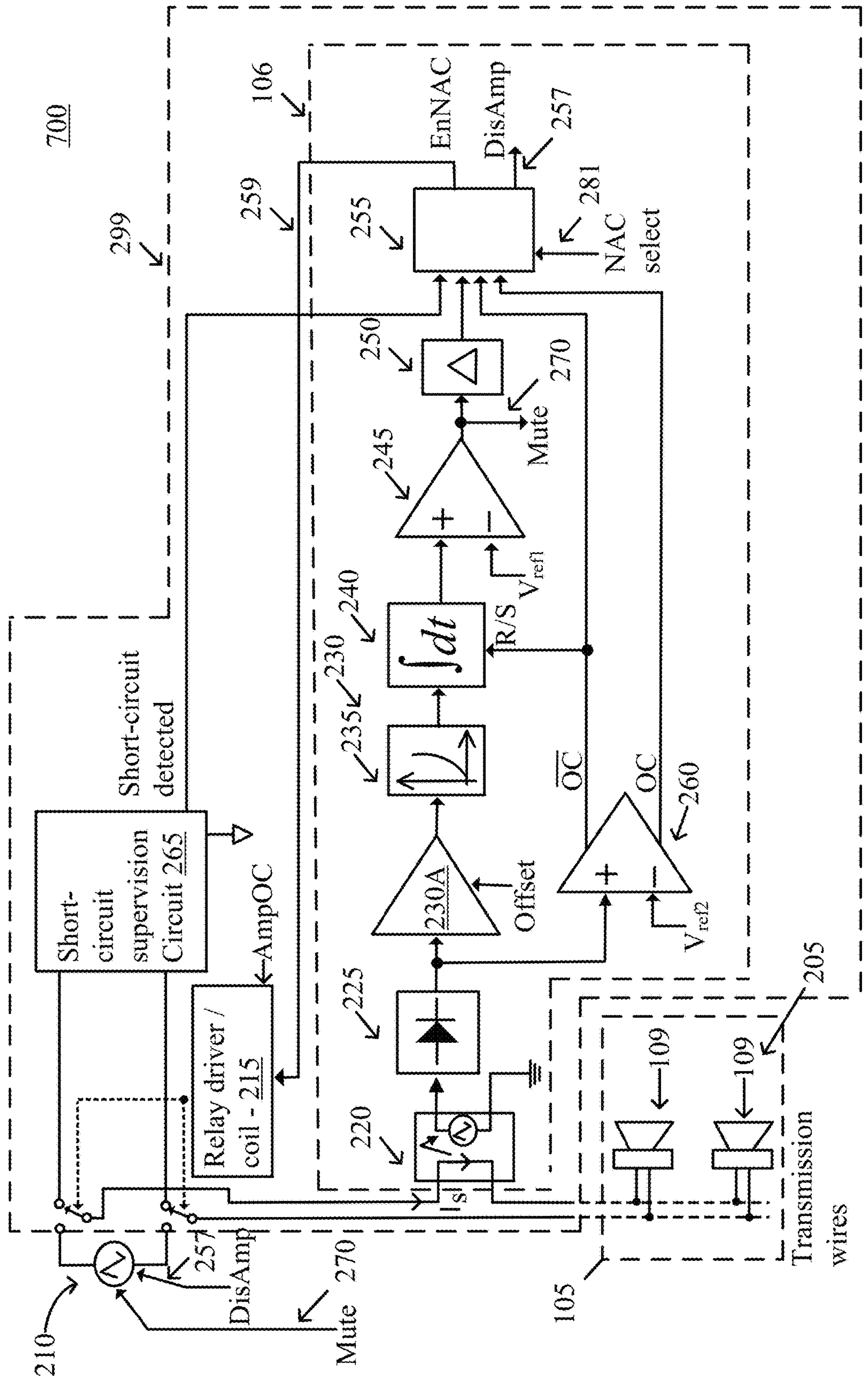
FIG. 7 illustrates a block diagram of another audio system having a NAC, in accordance with example aspects of this disclosure

Referring to FIG. 7, an example of the auto-recovery overcurrent protection circuit 106 is described with reference to an audio system 700 having a NAC 299 connected to a speaker circuit 205 with one or more speaker devices 109 to generate a sound-based alert, according to an example aspect.

Audio system 700 is similar to audio system 200 with the exception of amplifier 210 being enabled with an overcurrent detection feature that provides an Amplifier Over-Current (AmpOC) output signal that is delivered to the relay circuit 215. In case power amplifier 210 senses an overcurrent condition, power amplifier 210 will disconnect the speaker circuit 205 from power amplifier 210.

Additional aspects of the present disclosure may include one or more of the following clauses.

Clause 1. An audio system, comprising: a notification appliance circuit (NAC) having one or more speakers configured to reproduce sound; an amplifier circuit configured to drive the one or more speakers; a relay circuit configured to selectively connect or disconnect the speakers to or from the amplifier circuit responsive to an enable amplifier control signal or a disable amplifier control signal, respectively; a logic element configured to generate the enable amplifier control signal or the disable amplifier control signal responsive to an absence or a presence of an overcurrent condition in an output of the amplifier circuit, respectively; and an overcurrent detection circuit configurated to detect the absence or the presence of the overcurrent condition.

Clause 2. The audio system in accordance with clause 1, further comprising: a current sensor configured to receive a first alternating current (AC) signal output from the amplifier circuit and generate a second AC signal that simulates the first AC signal; a rectifier configured to convert the second AC signal into a direct current (DC) signal; an amplifier configured to amplify the DC signal into an amplified DC signal; and a comparator configured to generate a MUTE signal to mute the amplifier circuit responsive to the amplified DC signal during at least a portion of the overcurrent condition to prevent arcing of contacts of the relay circuit.

Clause 3. The audio system in accordance with any preceding clauses, wherein the amplifier comprises: a linear amplifier configured to amplify the DC signal into the amplified DC signal; and a non-linear amplifier configured to make a response speed of a circuit sub-portion exponentially proportional to an amplitude of the amplified DC signal.

Clause 4. The audio system in accordance with any preceding clauses, further comprising an integrator, operatively coupled between the amplifier and the comparator, configured to operate during the overcurrent condition to output a non-zero value to the comparator and otherwise to output a zero value.

Clause 5. The audio system in accordance with any preceding clauses, wherein the integrator is further configured to respond to the overcurrent condition through an overcurrent condition signal received via a reset and set input of the integrator.

Clause 6. The audio system in accordance with any preceding clauses, further comprising a delay circuit configured to delay an occurrence of the MUTE signal from being provided to the logic element and correspondingly delay a disconnection of the NAC from the amplifier circuit until after the amplifier circuit has reacted to the MUTE signal.

Clause 7. The audio system in accordance with any preceding clauses, wherein the current sensor comprises a current transformer and a shunt resistor for simulating the first AC output from the amplifier circuit.

Clause 8. The audio system in accordance with any preceding clauses, wherein the overcurrent detection circuit comprises a comparator circuit for comparing the DC signal to a reference voltage.

Clause 9. The audio system in accordance with any preceding clauses, further comprising a short-circuit supervision circuit, operatively connected between an output of the logic element and an input and the output of the amplifier circuit, configured to provide a short circuit detection signal to the logic element responsive to a detection of a short circuit condition between the input and the output of the amplifier circuit.

Clause 10. The audio system in accordance with any preceding clauses, wherein the logic element comprises a NAC select input configured to select a given NAC to be subject to overcurrent protection via automatic relay control.

Clause 11. A method of operating an audio system, comprising: configuring a notification appliance circuit (NAC) having one or more speakers to reproduce sound; configuring an amplifier circuit to drive the one or more speakers; configuring a relay circuit to selectively connect or disconnect the speakers to or from the amplifier circuit responsive to an enable amplifier control signal or a disable amplifier control signal, respectively; configuring a logic element to generate the enable amplifier control signal or the disable amplifier control signal responsive to an absence or a presence of an overcurrent condition in an output of the amplifier circuit, respectively; and configuring an overcurrent detection circuit to detect the absence or the presence of the overcurrent condition.

Clause 12. The method in accordance with clause 11, further comprising: configuring a current sensor to receive a first alternating current (AC) signal output from the amplifier circuit and generate a second AC signal that simulates the first AC signal; configuring a rectifier to convert the second AC signal into a direct current (DC) signal; configuring an amplifier to amplify the DC signal into an amplified DC signal; and configuring a comparator to generate a MUTE signal to mute the amplifier circuit responsive to the amplified DC signal during at least a portion of the overcurrent condition to prevent arcing of contacts of the relay circuit.

Clause 13. The method in accordance with any preceding clauses, further comprising forming the amplifier to include a linear amplifier configured to amplify the DC signal into the amplified DC signal, and a non-linear amplifier configured to make a response speed of a circuit sub-portion exponentially proportional to an amplitude of the amplified DC signal.

Clause 14. The method in accordance with any preceding clauses, further comprising configuring an integrator operatively coupled between the amplifier and the comparator to operate during the overcurrent condition to output a non-zero value to the comparator and otherwise to output a zero value.

Clause 15. The method in accordance with any preceding clauses, further comprising configuring the integrator to respond to the overcurrent condition through an overcurrent condition signal received via a reset and set input of the integrator.

Clause 16. The method in accordance with any preceding clauses, further comprising configuring a delay circuit to delay an occurrence of the MUTE signal from being provided to the logic element and correspondingly delay a disconnection of the NAC from the amplifier circuit until after the amplifier circuit has reacted to the MUTE signal.

Clause 17. A method of operating an audio system, comprising: selectively driving, by an amplifier circuit, one or more speakers of a notification appliance circuit (NAC); selectively connecting or disconnecting, by a relay circuit, the amplifier circuit from or to the one or more speakers responsive to an enable amplifier control signal or a disable amplifier control signal, respectively; detecting, by an overcurrent detection circuit, an absence or a presence of an overcurrent condition in an output of the amplifier circuit; and generating, by a logic element, the enable amplifier control signal or the disable amplifier control signal responsive to the absence or the presence of the overcurrent condition in the output of the amplifier circuit, respectively.

Clause 18. The method in accordance with clause 17, further comprising: generating, by a current sensor, a second AC signal that simulates a first AC signal; converting, by a rectifier, the second AC signal into a direct current (DC) signal; amplifying, by an amplifier, the DC signal into an amplified DC signal; and generating, by a comparator, a MUTE signal to mute the amplifier circuit responsive to the amplified DC signal during at least a portion of the overcurrent condition to prevent arcing of contacts of the relay circuit.

Clause 19. The method in accordance with any preceding clauses, further comprising forming the amplifier to include a linear amplifier configured to amplify the DC signal into the amplified DC signal, and a non-linear amplifier configured to make a response speed of a circuit sub-portion exponentially proportional to an amplitude of the amplified DC signal.

Clause 20. The method in accordance with any preceding clauses, further comprising configuring an integrator operatively coupled between the amplifier and the comparator to operate during the overcurrent condition to output a non-zero value to the comparator and otherwise to output a zero value.

Clause 21. The method in accordance with any preceding clauses, further comprising configuring the integrator to respond to the overcurrent condition through an overcurrent condition signal received via a reset and set input of the integrator.

Clause 22. The method in accordance with any preceding clauses, further comprising configuring a delay circuit to delay an occurrence of the MUTE signal from being provided to the logic element and correspondingly delay a disconnection of the NAC from the amplifier circuit until after the amplifier circuit has reacted to the MUTE signal.

Various aspects of the disclosure may take the form of an entirely or partially hardware aspect, an entirely or partially software aspect, or a combination of software and hardware. Furthermore, as described herein, various aspects of the disclosure (e.g., systems and methods) may take the form of a computer program product comprising a computer-readable non-transitory storage medium having computer-accessible instructions (e.g., computer-readable and/or computer-executable instructions) such as computer software, encoded or otherwise embodied in such storage medium. Those instructions can be read or otherwise accessed and executed by one or more processors to perform or permit the performance of the operations described herein. The instructions can be provided in any suitable form, such as source code, compiled code, interpreted code, executable code, static code, dynamic code, assembler code, combinations of the foregoing, and the like. Any suitable computer-readable non-transitory storage medium may be utilized to form the computer program product. For instance, the computer-readable medium may include any tangible non-transitory medium for storing information in a form readable or otherwise accessible by one or more computers or processor (s) functionally coupled thereto. Non-transitory storage media can include read-only memory (ROM); random access memory (RAM); magnetic disk storage media; optical storage media; flash memory, and so forth.

Aspects of this disclosure are described herein with reference to block diagrams and flowchart illustrations of methods, systems, apparatuses, and computer program products. It can be understood that each block of the block diagrams and flowchart illustrations, and combinations of blocks in the block diagrams and flowchart illustrations, respectively, can be implemented by computer-accessible instructions. In certain implementations, the computer-accessible instructions may be loaded or otherwise incorporated into a general-purpose computer, a special-purpose computer, or another programmable information processing apparatus to produce a particular machine, such that the operations or functions specified in the flowchart block or blocks can be implemented in response to execution at the computer or processing apparatus.

Unless otherwise expressly stated, it is in no way intended that any protocol, procedure, process, or method set forth herein be construed as requiring that its acts or steps be performed in a specific order. Accordingly, where a process or method claim does not actually recite an order to be followed by its acts or steps, or it is not otherwise specifically recited in the claims or descriptions of the subject disclosure that the steps are to be limited to a specific order, it is in no way intended that an order be inferred, in any respect. This holds for any possible non-express basis for interpretation, including: matters of logic with respect to the arrangement of steps or operational flow; plain meaning derived from grammatical organization or punctuation; the number or type of aspects described in the specification or annexed drawings; or the like.

As used in this disclosure, including the annexed drawings, the terms "component," "module," "system," and the like are intended to refer to a computer-related entity or an entity related to an apparatus with one or more specific functionalities. The entity can be either hardware, a combination of hardware and software, software, or software in execution. One or more of such entities are also referred to as "functional elements." As an example, a component can be a process running on a processor, a processor, an object, an executable, a thread of execution, a program, and/or a computer. For example, both an application running on a server or network controller, and the server or network controller can be a component. One or more components can reside within a process and/or thread of execution and a component can be localized on one computer and/or distributed between two or more computers. Also, these components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which parts can be controlled or otherwise operated by program code executed by a processor. As yet another example, a component can be an apparatus that provides specific functionality through electronic components without mechanical parts, the electronic components can include a processor to execute program code that provides, at least partially, the functionality of the electronic components. As still another example, interface(s) can include I/O components or Application Programming Interface (API) components. While the foregoing examples are directed to aspects of a component, the exemplified aspects or features also apply to a system, module, and similar.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in this specification and annexed drawings should be construed to mean "one or more" unless specified otherwise or clear from context to be directed to a singular form.

In addition, the terms "example" and "such as" and "e.g." are utilized herein to mean serving as an instance or illustration. Any aspect or design described herein as an "example" or referred to in connection with a "such as" clause or "e.g." is not necessarily to be construed as preferred or advantageous over other aspects or designs described herein. Rather, use of the terms "example" or "such as" or "e.g." is intended to present concepts in a concrete fashion. The terms "first," "second," "third," and so forth, as used in the claims and description, unless otherwise clear by context, is for clarity only and does not necessarily indicate or imply any order in time or space.

The term "processor," as utilized in this disclosure, can refer to any computing processing unit or device comprising processing circuitry that can operate on data and/or signaling. A computing processing unit or device can include, for example, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can include an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. In some cases, processors can exploit nano-scale architectures, such as molecular and quantum-dot based transistors, switches and gates, in order to optimize space usage or enhance performance of user equipment. A processor may also be implemented as a combination of computing processing units.

In addition, terms such as "store," "data store," data storage," "database," and substantially any other information storage component relevant to operation and functionality of a component, refer to "memory components," or entities embodied in a "memory" or components comprising the memory. It will be appreciated that the memory components described herein can be either volatile memory or nonvolatile memory, or can include both volatile and nonvolatile memory. Moreover, a memory component can be removable or affixed to a functional element (e.g., device, server).

Simply as an illustration, nonvolatile memory can include read only memory (ROM), programmable ROM (PROM), electrically programmable ROM (EPROM), electrically erasable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

Various aspects described herein can be implemented as a method, apparatus, or article of manufacture using special programming as described herein. In addition, various of the aspects disclosed herein also can be implemented by means of program modules or other types of computer program instructions specially configured as described herein and stored in a memory device and executed individually or in combination by one or more processors, or other combination of hardware and software, or hardware and firmware. Such specially configured program modules or computer program instructions, as described herein, can be loaded onto a general-purpose computer, a special-purpose computer, or another type of programmable data processing apparatus to produce a machine, such that the instructions which execute on the computer or other programmable data processing apparatus create a means for implementing the functionality of disclosed herein.

The term "article of manufacture" as used herein is intended to encompass a computer program accessible from any non-transitory computer-readable device, carrier, or media. For example, computer readable media can include but are not limited to magnetic storage devices (e.g., hard drive disk, floppy disk, magnetic strips, or similar), optical discs (e.g., compact disc (CD), digital versatile disc (DVD), blu-ray disc (BD), or similar), smart cards, and flash memory devices (e.g., card, stick, key drive, or similar).

The detailed description set forth herein in connection with the annexed figures is intended as a description of various configurations or implementations and is not intended to represent the only configurations or implementations in which the concepts described herein may be practiced. The detailed description includes specific details for the purpose of providing a thorough understanding of various concepts. However, it will be apparent to those skilled in the art that these concepts may be practiced without these specific details or with variations of these specific details. In some instances, well-known components are shown in block diagram form, while some blocks may be representative of one or more well-known components.

The previous description of the disclosure is provided to enable a person skilled in the art to make or use the disclosure. Various modifications to the disclosure will be readily apparent to those skilled in the art, and the common principles defined herein may be applied to other variations without departing from the scope of the disclosure. Furthermore, although elements of the described aspects may be described or claimed in the singular, the plural is contemplated unless limitation to the singular is explicitly stated. Additionally, all or a portion of any aspect may be utilized with all or a portion of any other aspect, unless stated otherwise. Thus, the disclosure is not to be limited to the examples and designs described herein but is to be accorded the widest scope consistent with the principles and novel features disclosed herein.

What is claimed is:

1. An audio system, comprising:

a notification appliance circuit (NAC) having one or more speakers configured to reproduce sound;

an amplifier circuit configured to drive the one or more speakers;

a relay circuit configured to selectively connect or disconnect the speakers to or from the amplifier circuit responsive to an enable amplifier control signal or a disable amplifier control signal, respectively;

a logic element configured to generate the enable amplifier control signal or the disable amplifier control signal responsive to an absence or a presence of an overcurrent condition in an output of the amplifier circuit, respectively;

an overcurrent detection circuit configured to detect the absence or the presence of the overcurrent condition;

a current sensor configured to receive a first alternating current (AC) signal output from the amplifier circuit and generate a second AC signal that simulates the first AC signal;

a rectifier configured to convert the second AC signal into a direct current (DC) signal;

an amplifier configured to amplify the DC signal into an amplified DC signal; and a comparator configured to generate a MUTE signal to mute the amplifier circuit responsive to the amplified DC signal during at least a portion of the overcurrent condition to prevent arcing of contacts of the relay circuit.

2. The audio system in accordance with claim 1, wherein the amplifier comprises:

a linear amplifier configured to amplify the DC signal into the amplified DC signal; and a non-linear amplifier configured to make a response speed of a circuit sub-portion exponentially proportional to an amplitude of the amplified DC signal.

3. The audio system in accordance with claim 1, further comprising an integrator, operatively coupled between the amplifier and the comparator, configured to operate during the overcurrent condition to output a non-zero value to the comparator and otherwise to output a zero value.

4. The audio system in accordance with claim 3, wherein the integrator is further configured to respond to the overcurrent condition through an overcurrent condition signal received via a reset and set input of the integrator.

5. The audio system in accordance with claim 1, further comprising a delay circuit configured to delay an occurrence of the MUTE signal from being provided to the logic element and correspondingly delay a disconnection of the NAC from the amplifier circuit until after the amplifier circuit has reacted to the MUTE signal.

6. The audio system in accordance with claim 1, wherein the current sensor comprises a current transformer and a shunt resistor for simulating the first AC signal output from the amplifier circuit.

7. The audio system in accordance with claim 1, wherein the overcurrent detection circuit comprises a comparator circuit for comparing the DC signal to a reference voltage.

8. The audio system in accordance with claim 1, further comprising a short-circuit supervision circuit, operatively connected between an output of the logic element and an input and the output of the amplifier circuit, configured to provide a short circuit detection signal to the logic element responsive to a detection of a short circuit condition between the input and the output of the amplifier circuit.

9. The audio system in accordance with claim 1, wherein the logic element comprises a NAC select input configured to select a given NAC to be connected or disconnected from the amplifier circuit via automatic relay control.

10. A method of operating an audio system, comprising:

configuring a notification appliance circuit (NAC) having one or more speakers to reproduce sound;

configuring an amplifier circuit to drive the one or more speakers;

configuring a relay circuit to selectively connect or disconnect the speakers to or from the amplifier circuit responsive to an enable amplifier control signal or a disable amplifier control signal, respectively;

configuring a logic element to generate the enable amplifier control signal or the disable amplifier control signal responsive to an absence or a presence of an overcurrent condition in an output of the amplifier circuit, respectively;

configuring an overcurrent detection circuit to detect the absence or the presence of the overcurrent condition;

configuring a current sensor to receive a first alternating current (AC) signal output from the amplifier circuit and generate a second AC signal that simulates the first AC signal;

configuring a rectifier to convert the second AC signal into a direct current (DC) signal;

configuring an amplifier to amplify the DC signal into an amplified DC signal; and configuring a comparator to generate a MUTE signal to mute the amplifier circuit responsive to the amplified DC signal during at least a portion of the overcurrent condition to prevent arcing of contacts of the relay circuit.

11. The method in accordance with claim 10, further comprising forming the amplifier to include a linear amplifier configured to amplify the DC signal into the amplified DC signal, and a non-linear amplifier configured to make a response speed of a circuit sub-portion exponentially proportional to an amplitude of the amplified DC signal.

12. The method in accordance with claim 10, further comprising configuring an integrator operatively coupled between the amplifier and the comparator to operate during the overcurrent condition to output a non-zero value to the comparator and otherwise to output a zero value.

13. The method in accordance with claim 12, further comprising configuring the integrator to respond to the overcurrent condition through an overcurrent condition signal received via a reset and set input of the integrator.

14. The method in accordance with claim 10, further comprising configuring a delay circuit to delay an occurrence of the MUTE signal from being provided to the logic element and correspondingly delay a disconnection of the NAC from the amplifier circuit until after the amplifier circuit has reacted to the MUTE signal.

15. A method of operating an audio system, comprising:

selectively driving, by an amplifier circuit, one or more speakers of a notification appliance circuit (NAC);

selectively connecting or disconnecting, by a relay circuit, the amplifier circuit from or to the one or more speakers responsive to an enable amplifier control signal or a disable amplifier control signal, respectively;

detecting, by an overcurrent detection circuit, an absence or a presence of an overcurrent condition in an output of the amplifier circuit;

generating, by a logic element, the enable amplifier control signal or the disable amplifier control signal responsive to the absence or the presence of the overcurrent condition in the output of the amplifier circuit, respectively-;

generating, by a current sensor, a second AC signal that simulates a first AC signal output from the amplifier circuit;

converting, by a rectifier, the second AC signal into a direct current (DC) signal;

amplifying, by an amplifier, the DC signal into an amplified DC signal; and generating, by a comparator, a MUTE signal to mute the amplifier circuit responsive to the amplified DC signal during at least a portion of the overcurrent condition to prevent arcing of contacts of the relay circuit.

16. The method in accordance with claim 15, further comprising forming the amplifier to include a linear amplifier configured to amplify the DC signal into the amplified DC signal, and a non-linear amplifier configured to make a response speed of a circuit sub-portion exponentially proportional to an amplitude of the amplified DC signal.

17. The method in accordance with claim 15, further comprising configuring an integrator operatively coupled between the amplifier and the comparator to operate during the overcurrent condition to output a non-zero value to the comparator and otherwise to output a zero value.

18. The method in accordance with claim 17, further comprising configuring the integrator to respond to the overcurrent condition through an overcurrent condition signal received via a reset and set input of the integrator.

19. The method in accordance with claim 15, further comprising configuring a delay circuit to delay an occurrence of the MUTE signal from being provided to the logic element and correspondingly delay a disconnection of the NAC from the amplifier circuit until after the amplifier circuit has reacted to the MUTE signal.

* * * * *